United States Patent
Kim et al.

(10) Patent No.: US 11,295,933 B2
(45) Date of Patent: Apr. 5, 2022

(54) SUBSTRATE PROCESSING APPARATUS AND SUBSTRATE PROCESSING METHOD

(71) Applicant: PSK INC., Gyeonggi-do (KR)

(72) Inventors: Geon Jong Kim, Gyeonggi-do (KR);
Tae Hwan Youn, Gyeonggi-do (KR);
Jong Chan Lee, Gyeonggi-do (KR)

(73) Assignee: PSK INC., Gyeonggi-do (KR)

( * ) Notice: Subject to any disclaimer, the term of this patent is extended or adjusted under 35 U.S.C. 154(b) by 0 days.

(21) Appl. No.: 16/886,479

(22) Filed: May 28, 2020

(65) Prior Publication Data

US 2021/0305014 A1    Sep. 30, 2021

(30) Foreign Application Priority Data

Mar. 30, 2020  (KR) .................. 10-2020-0038515

(51) Int. Cl.
| | |
|---|---|
| *H01J 37/32* | (2006.01) |
| *C23C 16/458* | (2006.01) |
| *H01L 21/687* | (2006.01) |
| *H01L 21/67* | (2006.01) |

(52) U.S. Cl.
CPC ...... *H01J 37/3244* (2013.01); *C23C 16/4586* (2013.01); *H01L 21/67063* (2013.01); *H01L 21/67098* (2013.01); *H01L 21/67248* (2013.01); *H01L 21/687* (2013.01)

(58) Field of Classification Search
CPC ............. H01J 37/3244; C23C 16/4586; H01L 21/67063; H01L 21/67098; H01L 21/67248; H01L 21/687

See application file for complete search history.

(56) References Cited

U.S. PATENT DOCUMENTS

2008/0182412 A1 *  7/2008  Bailey, III ........... H01L 21/0209
                                                                                     438/689

FOREIGN PATENT DOCUMENTS

| JP | 07142449 A | * | 6/1995 |
|---|---|---|---|
| KR | 20070066934 A | * | 6/2007 |
| KR | 1020120009596 A | | 2/2012 |
| KR | 200464038 Y1 | | 2/2013 |
| KR | 1020140084018 A | | 7/2014 |

* cited by examiner

*Primary Examiner* — Yuechuan Yu
(74) *Attorney, Agent, or Firm* — Procopio, Cory, Hargreaves & Savitch LLP (57) ABSTRACT

An apparatus for processing a substrate is provided. The apparatus for processing the substrate includes a housing having a process space, a gas supply unit to supply gas into the process space, a support unit including a chuck to support the substrate in the process space and a lower electrode to surround the chuck when viewed from a top, a temperature adjusting plate provided in the housing, a dielectric plate unit coupled to the temperature adjusting plate, and having a dielectric plate disposed in opposite to the substrate supported by the support unit in the process space, and an upper electrode unit coupled to the temperature adjusting plate, and having an upper electrode disposed in opposition to the lower electrode. The dielectric plate unit includes a first base disposed between the dielectric plate and the temperature adjusting plate.

13 Claims, 5 Drawing Sheets

SUBSTRATE PROCESSING APPARATUS AND SUBSTRATE PROCESSING METHOD

CROSS-REFERENCE TO RELATED APPLICATIONS

A claim for priority under 35 U.S.C. § 119 is made to Korean Patent Application No. 10-2020-0038515 filed on Mar. 30, 2020, in the Korean Intellectual Property Office, the entire contents of which are hereby incorporated by reference.

BACKGROUND

Embodiments of the inventive concept described herein relate to a substrate processing apparatus and a substrate processing method. More particularly, embodiments of the inventive concept described herein relate to a substrate processing apparatus and a substrate processing method, capable of processing a substrate using plasma.

Plasma refers to the state of an ionized gas including ions, radicals, and electrons, and is generated by very high temperatures, strong electric fields, or RF electromagnetic fields. A process of fabricating a semiconductor device includes an ashing or etching process to remove a film from a substrate using plasma. The ashing or etching process is performed as ions or radical particles contained in the plasma collide or react with the film on the substrate. The process of processing a substrate using plasma is performed through various manners. Among them, a bevel etching device to process an edge area of the substrate is to process the edge area of the substrate by transferring plasma to the edge area of the substrate.

Figure 1:
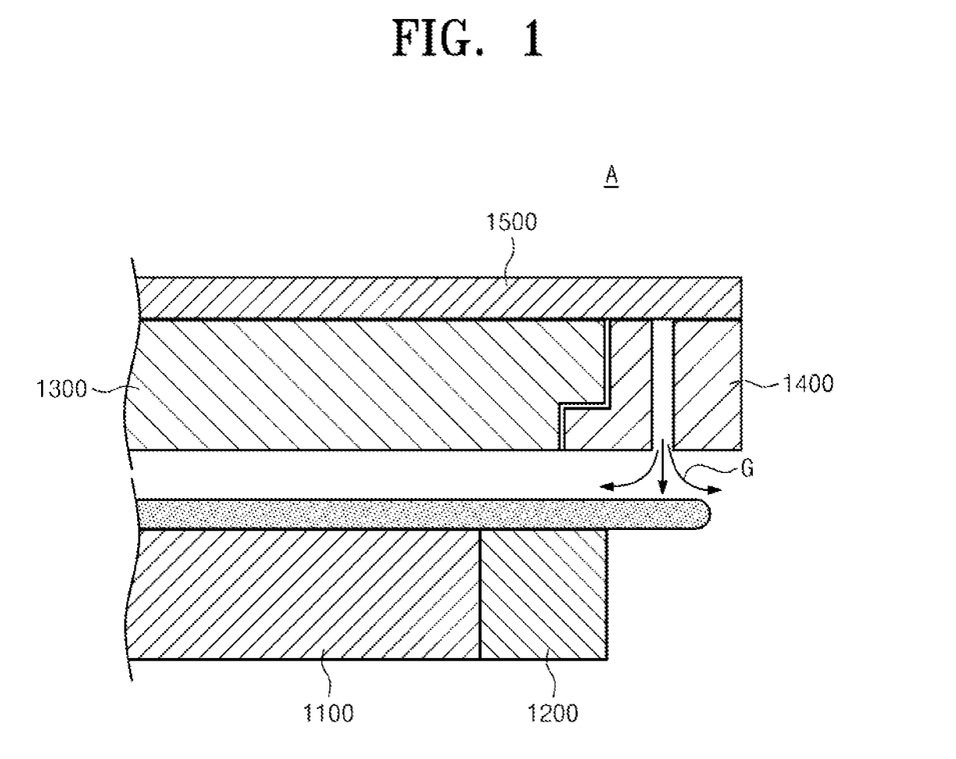
FIG. 1 is a view schematically illustrating a portion of a typical bevel etching device.

FIG. 1 is a view schematically illustrating a portion of a typical bevel etching device. A typical bevel etching device 'A' includes a chuck 1100, a lower insulator 1200, a dielectric plate 1300, a plasma exclusion zone (PEZ) ring 1400, and a cooling plate 1500.

The chuck 1100 has a surface for seating a substrate 'W'. The lower insulator 1200 is provided to surround the chuck 1100 when viewed from the top. The dielectric plate 1300 is disposed at a position opposite to a top surface of the substrate 'W' seated on the chuck 1100. The PEZ ring 1400 is provided to surround the dielectric plate 1300 when viewed from the top. A gas passage is formed in the PEZ ring 1400, and process gas 'G', which is excited to be in a plasma state, flows through the gas passage. In addition, a discharge end of the gas passage formed in the PEZ ring 1400 faces the edge area of the substrate 'W'. Accordingly, the process gas 'G' discharged from the gas passage flows toward the edge area of the substrate 'W', so a thin film on the edge area of the substrate 'W' is processed as the plasma is transferred to the substrate 'W'. In addition, the dielectric plate 1300 and the PEZ ring 1400 are coupled to the cooling plate 1500 to prevent a temperature from being excessively increased in the process of processing the substrate 'W'. The cooling plate 1500 generates cooling energy to minimize the increase in the temperatures of the dielectric plate 1300 and the PEZ ring 1400 in the process of processing the substrate 'W'.

However, when the edge area of the substrate 'W' is processed using the bevel etching device as described above, the change in a processing rate (e.g., an etching rate) is difficult depending on a processing condition required for the substrate 'W'. This is because the change of dielectric plate 1300 and/or the PEZ ring 1400. to be in another shape or to have another material is difficult depending on the type of the substrate 'W', when taking into consideration the functional characteristics of the dielectric plate 1300 and the PEZ ring 1400.

In general, the dielectric plate 1300 and the cooling plate 1500 are formed of mutually different materials. In general, the dielectric plate 1300 is formed of a ceramic material, and the cooling plate 1500 is formed of a metal material. In this case, since the dielectric plate 1300 and the cooling plate 1500 have mutually different thermal expansion rates due to the material characteristics thereof, the dielectric plate 1300 and the cooling plate 1500 may be distorted in the process of processing the substrate 'W'.

SUMMARY

Embodiments of the inventive concept provide a substrate processing apparatus and a substrate processing method, capable of efficiently processing a substrate.

Embodiments of the inventive concept provide a substrate processing apparatus and a substrate processing method, capable of enhancing the efficiency of plasma process for an edge area of a substrate.

Embodiments of the inventive concept provide a substrate processing apparatus and a substrate processing method, capable of changing the processing rate of a substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, there may be provided an apparatus for processing a substrate. The apparatus for processing the substrate may include a housing having a process space, a gas supply unit to supply gas into the process space, a support unit including a chuck to support the substrate in the process space and a lower electrode to surround the chuck when viewed from a top, a temperature adjusting plate provided in the housing, a dielectric plate unit coupled to the temperature adjusting plate, and having a dielectric plate disposed in opposite to the substrate supported by the support unit in the process space, and an upper electrode unit coupled to the temperature adjusting plate, and having an upper electrode disposed in opposition to the lower electrode. The dielectric plate unit may include a first base disposed between the dielectric plate and the temperature adjusting plate.

According to an exemplary embodiment, the first base may be formed of a material different from a material of the dielectric plate.

According to an exemplary embodiment, the first base may be formed of a material identical to a material of the temperature adjusting plate.

According to an exemplary embodiment, a thermal expansion rate of the first base may be more similar to a thermal expansion rate of the temperature adjusting plate rather than a thermal expansion rate of the dielectric plate.

According to an exemplary embodiment, the upper electrode unit may include a second base to surround the first base when viewed from the top, and disposed between the upper electrode and the temperature adjusting plate, and the first base and the second base may be spaced apart from each other to form a gas channel through which gas supplied by the gas supply unit flows.

According to an exemplary embodiment, the gas supply unit may include a first gas supply unit to supply process gas, which is excited to be in a plasma state, to the gas channel.

According to an exemplary embodiment, the second base may be formed of a material identical to a material of the temperature adjusting plate.

According to an exemplary embodiment, a thermal expansion rate of the second base may be more similar to a thermal expansion rate of the temperature adjusting plate rather than a thermal expansion rate of the upper electrode.

According to an exemplary embodiment, a discharge end of the gas channel may be formed toward an edge area of the substrate supported by the support unit.

According to an exemplary embodiment, the dielectric plate may include a gas passage through which gas supplied by the gas supply unit flows, and a discharge end of the gas passage may be formed toward a central area of the substrate supported by the support unit.

According to an exemplary embodiment, the gas supply unit may include a second gas supply part to supply inert gas to the gas passage.

In addition, the inventive concept provides a method for processing a substrate using a substrate processing apparatus.

According to an exemplary embodiment, in a method for processing a substrate, a plurality of the first bases may be provided, the plurality of first bases may have mutually different shapes and/or mutually different materials, plasma may be transferred to an edge area of the substrate, which is introduced in the process space and supported by the support unit, to etch the edge area of the substrate, one first base selected from the first bases may be disposed between the dielectric plate and the temperature adjusting plate, when the substrate processed in the process space is a first substrate, and another first base selected from the first bases may be disposed between the dielectric plate and the temperature adjusting plate to change an etching rate for the edge area of the substrate, when the substrate processed in the process space is a second substrate different from the first substrate.

According to an exemplary embodiment, in a method for processing a substrate, a plurality of the second bases may be provided, the plurality of second bases may have mutually different shapes and/or mutually different materials, plasma may be transferred to an edge area of the substrate, which is introduced in the process space and supported by the support unit, to etch the edge area of the substrate, one second base selected from the second bases may be disposed between the upper electrode and the temperature adjusting plate, when the substrate processed in the process space is a first substrate, and another second base selected from the second bases may be disposed between the upper electrode and the temperature adjusting plate to change an etching rate for the edge area of the substrate, when the substrate processed in the process space is a second substrate different from the first substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, the embodiment of the inventive concept will be described in detail with reference to accompanying drawings to allow those skilled in the art to easily reproduce the inventive concept. However, the inventive concept may be implemented in various forms, and is limited to embodiments described herein. In addition, in the following detailed description of the inventive concept, a detailed description of well-known art or functions will be ruled out in order not to unnecessarily obscure the gist of the inventive concept. In addition, parts performing similar functions and similar operations will be assigned with the same reference numerals throughout the drawings When a certain part "includes" a certain component, the certain part does not exclude other components, but may further include other components if there is a specific opposite description. In detail, it will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, components, and/or the combination thereof.

The singular forms are intended to include the plural forms unless the context clearly indicates otherwise. In addition, the shapes and the sizes of components in accompanying drawings will be exaggerated for more apparent description.

Hereinafter, the embodiments of the inventive concept will be described in detail with reference to FIGS. 2 to 5.

Figure 2:
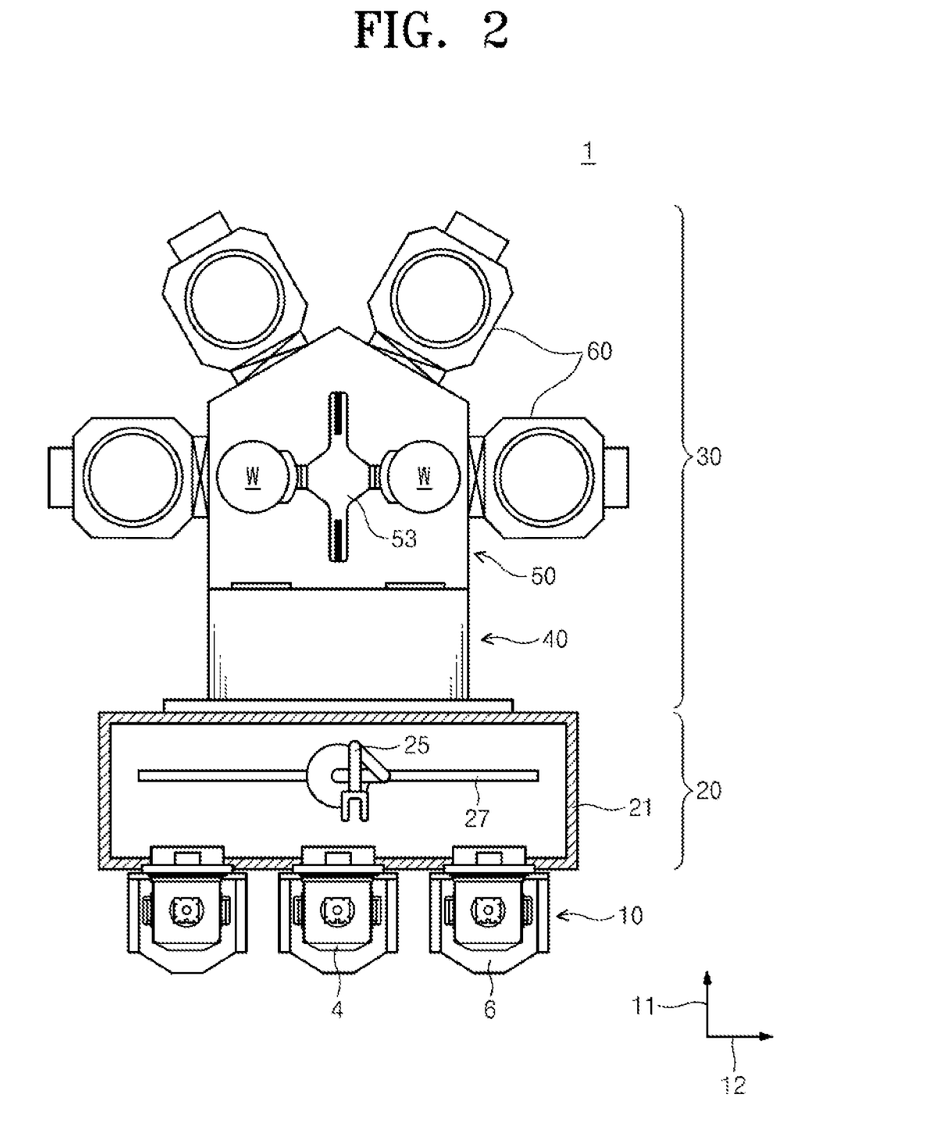
FIG. 2 is a view schematically illustrating a substrate processing equipment, according to an embodiment of the inventive concept.

FIG. 2 is a view schematically illustrating a substrate processing equipment, according to an embodiment of the inventive concept. Referring to FIG. 2, a substrate processing equipment 1 has an equipment front end module (EFEM) 20 and a processing module 30. The EFEM 20 and the processing module 30 are disposed in one direction.

The EFEM 20 has a load port 10 and a transfer frame 21. The load port 10 is disposed in a front end portion of the EFEM 20 in a first direction 11. The load port 10 has a plurality of support parts 6. The support parts 6 are aligned in line with each other in a second direction 12, and a carrier 4 (for example, a cassette, or FOUP), in which a substrate 'W' to be provided for a process or a substrate 'W' having completely processed are received, is seated on the support part 6. The carrier 4 receives the substrate 'W' to be provided for a process or the substrate 'W' having completely processed. The transfer frame 21 is disposed between the load port 10 and the processing module 30. The transfer frame 21 includes a first transfer robot 25 disposed inside the transfer frame 21 to transfer the substrate 'W' between the load port 10 and the processing module 30. The first transfer robot 25 moves along a transfer rail 27 extending in the second direction 12 to transfer the substrate 'W' between the carrier 4 and the processing module 30.

The processing module 30 includes a load lock chamber 40, a transfer chamber 50, and a process chamber 60. The processing module 30 may receive the substrate 'W' from the EFEM 20 to process the substrate 'W'.

The load lock chamber 40 is disposed to be adjacent to the transfer frame 21. For example, the load lock chamber 40 may be disposed between the transfer chamber 50 and the EFEM 20. The load lock chamber 40 provides a space in which the substrate 'W' to be provided for the process stands by before the substrate 'W' is transferred to the process chamber 60, or the substrate 'W' having completely processed stands by before the substrate 'W' is transferred to the EFEM 20.

The transfer chamber 50 may carry the substrate 'W'. The transfer chamber 50 is disposed to be adjacent to the load lock chamber 40. The transfer chamber 50 has a body in a polygonal shape when viewed from the top. Referring to FIG. 2, the transfer chamber 50 has a body in a pentagonal shape when viewed from the top. A load lock chamber 40 and a plurality of process chambers 60 are disposed outside the body and arranged along the circumference of the body. A passage (not illustrated), which is formed through each sidewall of the body to allow the substrate 'W' to enter and exit, connects the transfer chamber 50 with the load lock chamber 40 or connects the transfer chamber 50 with the process chambers 60. A door (not illustrated) is provided at each passage to close or open the passage such that an inner part of the body is sealed. A second transfer robot 53 is disposed in an inner space of the transfer chamber 50 to transfer the substrate 'W' between the load lock chamber 40 and the process chambers 60. The second transfer robot 53 transfers a substrate 'W', which is unprocessed and stands by in the load lock chamber 40, to the process chamber 60, or transfers the substrate 'W', which has completely processed, to the load lock chamber 40. In addition, the second transfer robot 53 transfers the substrate 'W' between the process chambers 60 to sequentially provide the substrate 'W' to the plurality of process chambers 60. As illustrated in FIG. 2, when the transfer chamber 50 has the polygonal body, the load lock chamber 40 is disposed on a sidewall, which is closer to the EFEM 20, of the transfer chamber 50 and the process chambers 60 are sequentially disposed on remaining sidewalls of the transfer chamber 50. The transfer chamber 50 may be provided in various shapes depending on required process modules, as well as the above shape.

The process chamber 60 may be disposed to be closer to the transfer chamber 50. The process chambers 60 are arranged along the circumference of the transfer chamber 50. A plurality of process chambers 60 may be provided. In each process chamber 60, the processing for the substrate 'W' may be performed. The process chamber 60 receives the substrate 'W' from the second transfer robot 53, and performs the processing for the substrate 'W'. In addition, the process chamber 60 provides the substrate 'W', which has completely processed, to the second transfer robot 53. Mutually different processes may be performed in the process chambers 60, respectively.

Hereinafter, a substrate processing apparatus 1000 to perform a plasma process in the process chamber 60 will be described. In addition, the following description of the substrate processing apparatus 1000 will be made, by way of example, in that the substrate processing apparatus 1000 is configured to perform the plasma process for an edge area of a substrate in the process chamber 60. However, the inventive concept is not limited thereto, and the substrate processing apparatus 1000 to be described below may be identically or similarly applied to various chambers to perform the processing for a substrate. In addition, the substrate processing apparatus 1000 may be identically or similarly applied to various chambers to perform the plasma process for a substrate.

Figure 3:
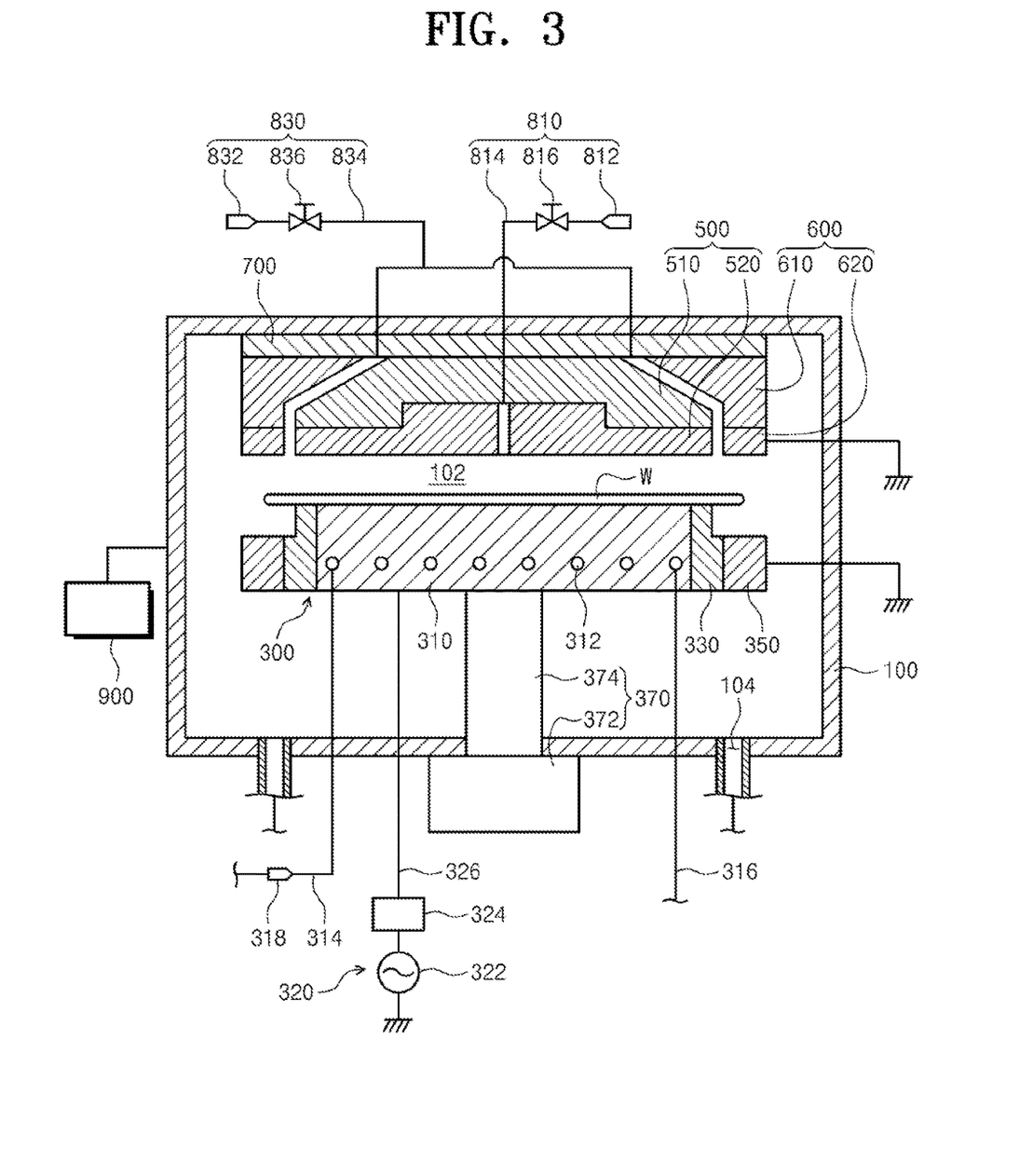
FIG. 3 is a view illustrating a substrate processing apparatus provided in a process chamber of FIG. 2, according to an embodiment.

FIG. 3 is a view illustrating a substrate processing apparatus provided in a process chamber of FIG. 2, according to an embodiment. Referring to FIG. 3, the substrate processing apparatus 1000 provided in the process chamber 60 performs a specific process on the substrate 'W' using plasma. For example, the substrate processing apparatus 1000 may etch or ash a film on the substrate 'W'. The film may include various types of films, such as a polysilicon film, a silicon oxide film, and a silicon nitride film. Further, the film may be a natural oxide film or an oxide film which is chemically produced. In addition, the film may be a by-product produced in processing the substrate. In addition, the film may be a foreign matter attached to and/or remaining on the substrate 'W'.

The substrate processing apparatus 1000 may perform a plasma process for the substrate 'W'. For example, the substrate processing apparatus 1000 may supply process gas, generate plasma from the supplied process gas, and process the substrate W. For example, the substrate processing apparatus 1000 may supply process gas, generate plasma from the supplied process gas, and process an edge area of the substrate W. The following description will be made by way of example in that the substrate processing apparatus 1000 is a bevel etching device to perform the etching for the edge area of the substrate 'W'.

The substrate processing apparatus 1000 may include a housing 100, a support unit 300, a dielectric plate unit 500, an upper electrode unit 600, a temperature adjusting plate 700, a gas supply unit 800, and a controller 900.

The housing 100 may have a process space 102 therein. The housing 100 may be formed in one surface thereof with an opening (not illustrated). The substrate 'W' may be introduced into or withdrawn out of the process space 102 of the housing 100 through the opening formed in the housing 100. The opening may be open or closed by an opening/closing member such as a door (not illustrated). When the opening of the housing 100 is open or closed by the opening/closing member, the process space 102 of the housing 100 may be isolated from the outside. In addition, the atmosphere of the process space 102 of the housing 100 may be adjusted to be at a lower pressure similar to a vacuum state after the process space 102 of the housing 100 is isolated. In addition, the housing 100 may be formed of a material such as metal. In addition, the surface of the housing 100 may be coated with an insulating material.

In addition, a discharge hole 104 may be formed in a bottom surface of the housing 100. Plasma 'P' generated from the process space 102 or gas 'G1' and 'G2' supplied into the process space 102 may be discharged to the outside through the discharge hole 104. In addition, the by-product generated in processing the substrate 'W' using the plasma 'P' may be discharged to the outside through the discharge hole 104. In addition, the discharge hole 104 may be connected with a discharge line (not illustrated). The discharge line may be connected with a pressure reducing member to provide pressure reduction. The pressure reducing member may provide pressure reduction to the process space 102.

The support unit 300 may support the substrate 'W' in the process space 102. The support unit 300 may include a chuck 310, a power supply member 320, an insulating ring 330, a lower electrode 350, and a driving member 370.

The chuck 310 may have a support surface supporting the substrate 'W'. The chuck 310 may have a circular shape when viewed from the top. The chuck 310 may have a diameter smaller than the diameter of the substrate 'W' when viewed from the top. Accordingly, the central area, which is supported by the chuck 310, of the substrate 'W' is seated on a support surface of the chuck 310, and the edge area of the substrate 'W' may not make contact with the support surface of the chuck 310.

A heating unit (not illustrated) may be provided inside the chuck 310. The heating unit (not illustrated) may heat the chuck 310. The heating unit may be a heater. In addition, a cooling fluid passage 312 may be formed in the chuck 310. The cooling fluid passage 312 may be formed inside the chuck 310. The cooling fluid passage 312 may be connected with a cooling fluid supply line 314 and a cooling fluid discharge line 316. The cooling fluid supply line 314 may be connected with a cooling fluid supply source 318. The cooling fluid supply source 318 may store a cooling fluid and/or may supply the cooling fluid to the cooling fluid supply line 314. In addition, the cooling fluid supplied to the cooling fluid passage 312 may be discharged to the outside through the cooling fluid discharge line 316. The cooling fluid stored by the cooling fluid supply source 318 and/or supplied from the cooling fluid supply source 318 may be a cooling water or cooling gas. The shape of the cooling fluid passage 312 formed in the chuck 310 is not limited to the shape illustrated in FIG. 3, but variously modified. In addition, a component to cool the chuck 310 is not limited to a component to supply the cooling fluid, but may include various components (for example, a cooling plate) that are able to the chuck 310.

The power supply member 320 may supply power to the chuck 310. The power supply member 320 may include a power source 322, a matcher 324, and a power line 326. The power source 322 may be a bias power supply. The power source 322 may be connected with the chuck 310 through the power line 326. In addition, the matcher 324 is provided on the power line 326 to perform impedance matching.

The insulating ring 330 may be provided in a ring shape when viewed from the top. The insulating ring 330 may be provided to surround the chuck 310, when viewed from the top. For example, the insulating ring 330 may have a ring shape. In addition, the insulating ring 330 may have a step difference such that the height of a top surface of an inner area of the insulating ring 330 is different from the height of a top surface of an outer area of the insulating ring 330. For example, the insulating ring 330 may have the step difference such that the height of the top surface of the inner area of the insulating ring 330 is higher than the height of the top surface of the outer area of the insulating ring 330. When the substrate 'W' is seated on the support surface of the chuck 310, the top surface of the inner area of the top surface of the inner area of the insulating ring 330 and the top surface of the outer area of the insulating ring 330, may make contact with the bottom surface of the substrate 'W'. When the substrate 'W' is seated on the support surface of the chuck 310, the top surface of the outer area of the top surface of the inner area of the insulating ring 330 and the top surface of the outer area of the insulating ring 330, may be spaced apart from the bottom surface of the substrate 'W'. The insulating ring 330 may be disposed between the chuck 310 and the lower electrode 350 to be described later. Since a bias power supply is provided in the chuck 310, the insulating ring 330 may be disposed between the chuck 310 and the lower electrode 350 to be described later. The insulating ring 330 may be formed of a material having an insulating property.

The lower electrode 350 may be disposed under the edge area of the substrate 'W' supported by the chuck 310. The lower electrode 350 may be provided in a ring shape when viewed from the top. The lower electrode 350 may be provided to surround the insulating ring 330 when viewed from the top. The top surface of the lower electrode 350 may have the same height as that of the top surface of the outer area of the insulating ring 330. The bottom surface of the lower electrode 350 may have the same height as that of the bottom surface of the insulating ring 330. In addition, the top surface of the lower electrode 350 may be provided to be lower than the top surface of the central part of the chuck 310. In addition, the lower electrode 350 may be provided to be spaced from the bottom surface of the substrate 'W' supported by the chuck 310. In addition, the lower electrode 350 may be provided to be spaced from the bottom surface of the edge area of the substrate 'W' supported by the chuck 310.

The lower electrode 350 may be disposed to face an upper electrode 620 to be described later. The lower electrode 350 may be disposed to be under the upper electrode 620 to be described later. The lower electrode 350 may be grounded. The lower electrode 350 may increase the density of plasma by inducing coupling of bias power applied to the chuck 310. Accordingly, the processing efficiency for the edge area of the substrate 'W may be improved.

The driving member 370 may elevate the chuck 310. The driving member 370 may include a driver 372 and a shaft 374. The shaft 374 may be coupled to the chuck 310. The shaft 374 may be connected with the driver 372. The driver 372 may elevate the chuck 310 in the vertical direction through the shaft 374.

The dielectric plate unit 500 may include a dielectric plate 520 and a first base 510. In addition, the dielectric plate unit 500 may be coupled to the temperature adjusting plate 700 to be described later.

The dielectric plate 520 may have a circular shape when viewed from the top. In addition, a top surface of the dielectric plate 520 may have a step difference such that the height of the central area of the dielectric plate 520 is higher than the height of an edge area of the dielectric plate 520. In addition, a bottom surface of the dielectric plate 520 may be provided in a flat shape. The dielectric plate 520 may be disposed to face the substrate 'W' supported by the support unit 300 in the process space 102. The dielectric plate 520 may be disposed on the support unit 300. The dielectric plate 520 may be formed of a material including ceramic. The dielectric plate 520 may have a gas passage formed to be connected with a first gas supply part 810 of a gas supply unit 800 to be described later. In addition, a discharge end of the gas passage may be configured such that the first gas G1 to be supplied by the first gas supply part 810 is supplied to the central area of the substrate 'W' supported by the support unit 300. In addition, the discharge end of the gas passage such that the first gas G1 is supplied to the top surface of the central area of the substrate 'W' supported by the support unit 300.

The first base 510 may be disposed between the dielectric plate 520 and the temperature adjusting plate 700 to be described later. The first base 510 may be coupled to the temperature adjusting plate 700 to be described later, and the dielectric plate 520 may be coupled to the first base 510. Accordingly, the dielectric plate 520 may be coupled to the temperature adjusting plate 700 through the first base 510.

The first base 510 may have a diameter gradually reduced downward. The top surface of the first base 510 may have a diameter smaller than a diameter of a bottom surface of the dielectric plate 520. The top surface of the first base 510 may have a flat shape. In addition, the bottom surface of the first base 510 may have a stepped shape. For example, the bottom surface of the edge area of the first base 510 may be stepped to be lower than the bottom surface of the central area of the first base 510 in terms of height. In addition, the bottom surface of the first base 510 and the top surface of the dielectric plate 520 may have shapes allowing the combination between the bottom surface of the first base 510 and the top surface of the dielectric plate 520. For example, the central area of the dielectric plate 520 may be inserted into the central area of the first base 510. In addition, the first base 510 may be formed of a material including metal. For example, the first base 510 may be formed of a material including aluminum (Al).

The upper electrode unit 600 may include a second base 610 and an upper electrode 620. In addition, the upper electrode unit 600 may be coupled to the temperature adjusting plate 700 to be described later.

The upper electrode 620 may face the lower electrode 350 to be described later. The upper electrode 620 may be disposed on the lower electrode 350. The upper electrode 620 may be disposed under the edge area of the substrate 'W' supported by the chuck 310. The upper electrode 620 may be grounded.

The upper electrode 620 may have a shape to surround the dielectric plate 520 when viewed from the top. The upper electrode 620 may be provided to be spaced apart from the dielectric plate 520. The upper electrode 620 is spaced apart from the dielectric plate 520 to form a space. The space may form a portion of a gas channel allowing the gas G2, which is supplied by a second gas supply part 830, to flow. A discharge end of the gas channel may be configured such that the second gas G2 is supplied to the edge area of the substrate 'W' supported by the support unit 300. In addition, the discharge end of the gas passage may be configured such that the second gas G2 is supplied to the top surface of the edge area of the substrate 'W' supported by the support unit 300.

The second base 610 may be disposed between the upper electrode 620 and the temperature adjusting plate 700 to be described later. The second base 610 may be coupled to the temperature adjusting plate 700 to be described later, and the upper electrode 620 may be coupled to the second base 610. Accordingly, the upper electrode 620 may be coupled to the temperature adjusting plate 700 through the second base 610.

The second base 610 may have a ring shape when viewed from the top. The top surface and the bottom surface of the second base 610 may have flat shapes. The second base 610 may have the shape to surround the first base 510 when viewed from the top. The second base 610 may have an inner diameter gradually reduced downward. The second base 610 may be provided to be spaced from the first base 510. The second base 610 is spaced apart from the first base 510 to form a space. The space may form a portion of a gas channel allowing the gas G2, which is supplied by the second gas supply part 830, to flow. In addition, the second base 610 may be formed of a material including metal. For example, the second base 610 may be formed of a material including aluminum (Al).

The temperature adjusting plate 700 may be coupled to the dielectric plate unit 500 and the upper electrode unit 600. The temperature adjusting plate 700 may be provided in the housing 100. The temperature adjusting plate 700 may generate heat. For example, the temperature adjusting plate 700 may generate heating energy or cooling energy. The temperature adjusting plate 700 may generate heat by receiving a signal from the controller 900 to be described later. The temperature adjusting plate 700 may generate heating energy or cooling energy to perform a control operation such that the temperatures of the dielectric plate unit 500 and the upper electrode unit 600 may be more uniformly maintained. For example, the temperature adjusting plate 700 may generate cooling energy to prevent the temperatures of the dielectric plate unit 500 and the upper electrode unit 600 from being excessively increased in processing the substrate 'W' as much as possible.

The gas supply unit 800 may supply gas into the process space 102. The gas supply unit 800 may supply the first gas G1 and the second gas G2 to the process space 102. The gas supply unit 800 may include a first gas supply part 810 and the second gas supply part 830.

The first gas supply part 810 may supply the first gas G1 into the process space 102. The first gas G1 may be an inert gas such as nitrogen. The first gas supply part 810 may supply the first gas G1 to the central area of the substrate 'W' supported by the chuck 310. The first gas supply part 810 may include a first gas supply source 812, a first gas supply line 814, and a first valve 816. The first gas supply source 812 may store the first gas 'G1' and/or supply the first gas 'G1' to the first gas supply line 814. The first gas supply line 814 may be connected to the flow passage formed in the dielectric plate 520. The first valve 816 may be installed on the first gas supply line 814. The first valve 816 may be an on/off valve or may be provided as a flow control valve. The first gas G1 supplied by the first gas supply source 812 may be supplied to the central area of the top surface of the substrate 'W' through the fluid passage formed in the dielectric plate 520.

The second gas supply part 830 may supply the second gas G2 into the process space 102. The second gas G2 may be process gas excited to be in a plasma state. The second gas supply part 830 may supply the second gas G2 to the edge area of the substrate 'W' through a gas channel formed as the dielectric plate 520 and the first base 510, and the upper electrode 620 and the second base 610, which are provided on the edge area of the substrate 'W' supported by the chuck 310, are spaced apart from each other. The second gas supply part 830 may include a second gas supply source 832, a second gas supply line 834, and a second valve 836. The second gas supply source 832 may store the second gas 'G2' and/or supply the second gas 'G2' to the second gas supply line 834. The second gas supply line 834 may supply the second gas G2 to the space serving as the gas channel. The second valve 836 may be installed on the second gas supply line 834. The second valve 836 may be an on/off valve or may be provided as a flow control valve. The second gas G2 supplied by the second gas supply source 832 may be supplied to the edge area of the top surface of the substrate 'W through a second fluid passage 602.

The controller 900 may control the substrate processing apparatus 1000. The controller 900 may control the substrate processing apparatus 1000 to perform the plasma process to be performed later. For example, the controller 900 may control the gas supply unit 800, the temperature adjusting plate 700, and the support unit 300. For example, the controller 900 may control the support unit 300 and the gas supply unit 800 such that the plasma 'P' is generated from the edge area of the substrate 'W' supported by the chuck 310 as the power source 322 supplies power to the chuck 310 when the gas is supplied to the first gas supply part 810 and/or the second gas supply part 830.

Figure 4:
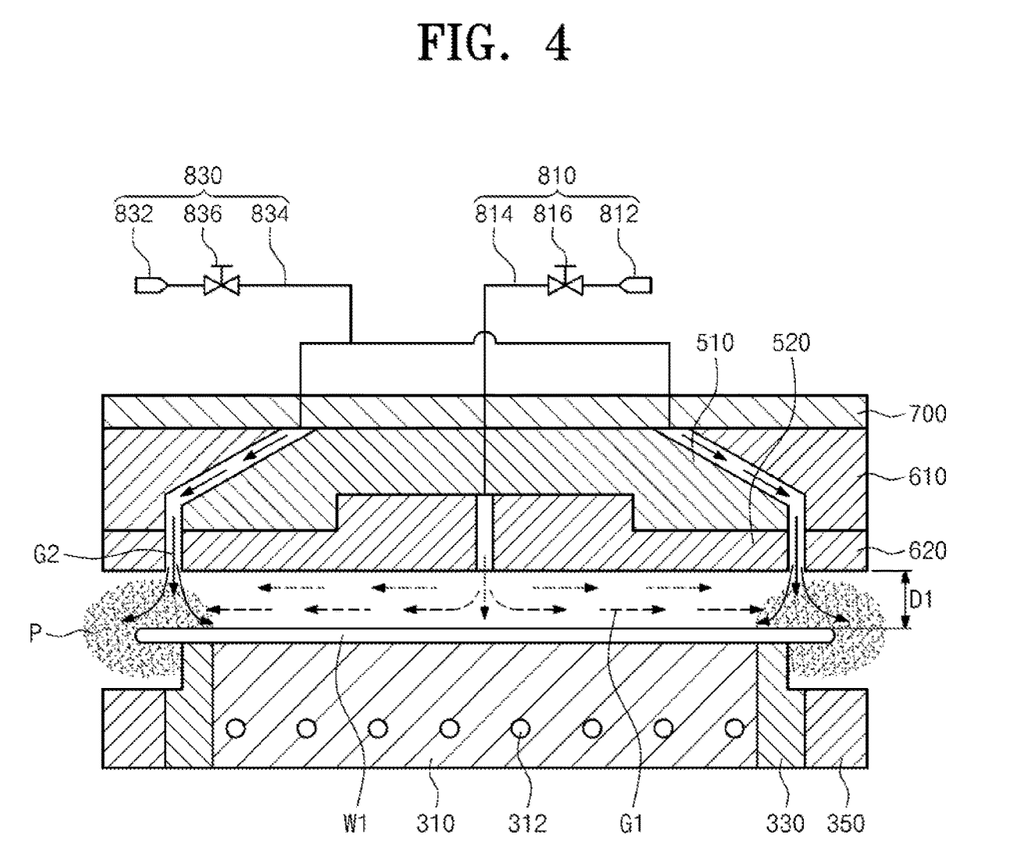
FIG. 4 is a view illustrating that the substrate processing apparatus of FIG. 3 performs plasma process, according to an embodiment.

FIG. 4 is a view illustrating that the substrate processing apparatus of FIG. 3 performs a plasma process, according to an embodiment. Referring to FIG. 4, according to an embodiment of the inventive concept, the substrate processing apparatus 1000 may process the edge area of the substrate 'W'. For example, the substrate processing apparatus 1000 may process the edge area of the substrate 'W' by generating the plasma 'P' from the edge area of the substrate 'W'. For example, the substrate processing apparatus 1000 may perform a bevel etching process to process the edge area of the substrate 'W'. The substrate processing apparatus 1000 may allow the first gas supply part 810 to supply the first gas G1 to the central area of the substrate 'W and allow the second gas supply part 830 to supply the second gas G2 to the edge area of the substrate 'W', when processing the edge area of the substrate 'W'. The second gas G2 supplied by the second gas supply part 830 is process gas to be excited to be in the plasma state such that the edge area of the substrate 'W' is processed. For example, a thin film on the edge area of the substrate 'W' may be etched through the plasma 'P'. In addition, the first gas G1 supplied to the central area of the substrate 'W' is inert gas and prevents the second gas G2 from being introduced into the central area of the substrate 'W', thereby more improving the processing efficiency for the edge area of the substrate 'W'. In addition, during the processing for the substrate 'W', the temperature adjusting plate 700 may generate cooling energy to prevent the temperatures of the dielectric plate unit 500 and the upper electrode unit 600 from being excessively increased.

According to an embodiment of the inventive concept, the first base 510 is disposed between the dielectric plate 520 and the temperature adjusting plate 700. The first base 510 is formed of a material different from a material of the dielectric plate 520 and the same as a material of the temperature adjusting plate 700. The thermal expansion rate of the first base 510 may be more similar to the thermal expansion rate of the temperature adjusting plate 700 rather than the thermal expansion rate of the dielectric plate 520. In other words, as the first base 510 is disposed between the dielectric plate 520 and the temperature adjusting plate 700, the distortion of the temperature adjusting plate 700 and the dielectric plate 520, which is caused due to the cooling energy generated form the temperature adjusting plate 700, may be minimized. This is because the first base 510 directly making contact with the temperature adjusting plate 700 is formed of a material similar to a material of the temperature adjusting plate 700.

Similarly, according to an embodiment of the inventive concept, the second base 610 is disposed between the upper electrode 620 and the temperature adjusting plate 700. The second base 610 is formed of a material different from a material of the upper electrode 620 and the same as a material of the temperature adjusting plate 700. The thermal expansion rate of the second base 610 may be more similar to the thermal expansion rate of the temperature adjusting plate 700 rather than the thermal expansion rate of the upper electrode 620. In other words, as the second base 610 is disposed between the upper electrode 620 and the temperature adjusting plate 700, the distortion of the temperature adjusting plate 700 and the upper electrode 620, which is caused due to the cooling energy generated form the temperature adjusting plate 700, may be minimized. This is because the second base 610 directly making contact with the temperature adjusting plate 700 is formed of a material similar to a material of the temperature adjusting plate 700.

Figure 5:
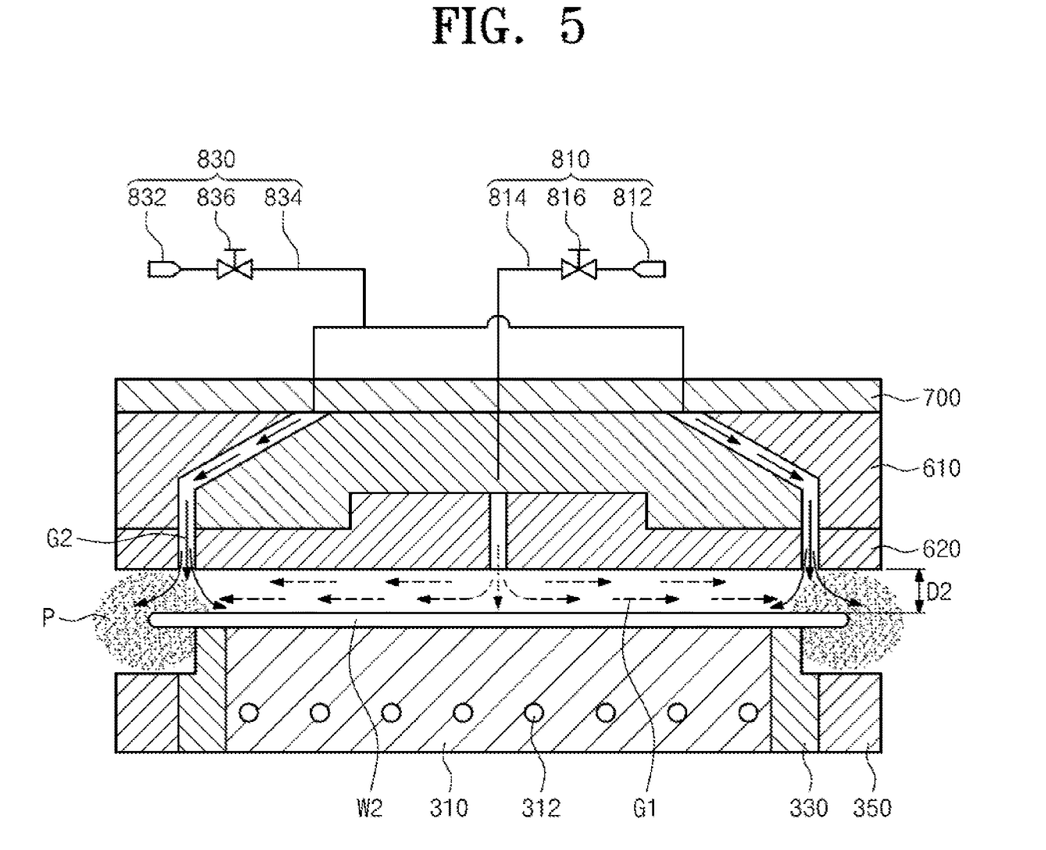
FIG. 5 is a view illustrating that the substrate processing apparatus of FIG. 3 performs plasma process, according to an embodiment.

Hereinafter, a substrate processing method according to an embodiment of the inventive concept will be described with reference to FIGS. 4 and 5. FIG. 4 is a view illustrating that the substrate processing apparatus of FIG. 3 performs the plasma process, according to an embodiment, and FIG. 5 is a view illustrating that the substrate processing apparatus of FIG. 3 performs the plasma process, according to another embodiment. According to an embodiment of the inventive concept, the processing rate, for example, the etching rate of the edge area of the substrate 'W' may be changed by changing the first base 510 disposed between the temperature adjusting plate 700 and the dielectric plate 520, and/or the second base 610 between the temperature adjusting plate 700 and the upper electrode 620.

A plurality of first bases 510 may be provided. The plurality of first bases 510 may have mutually different shapes and/or mutually different materials. A plurality of second bases 610 may be provided. The plurality of second bases 610 may have mutually different shapes and/or mutually different materials. The user may couple one of the first bases 510 to the temperature adjusting plate 700 and couple one of the second bases 610 to the temperature adjusting plate 700, thereby changing the etching rate of the substrate 'W'.

For example, when the substrate 'W' is introduced into the process space 102, the plasma 'P' is applied to the edge area of a first substrate 'W1' supported by the support unit 300 to etch the edge area of the first substrate 'W1', any one selected from the first bases 510 is disposed between the temperature adjusting plate 700 and the dielectric plate 520, and any one selected from the second bases 610 is disposed between the temperature adjusting plate 700 and the upper electrode 620. Differently, when the edge area of a second substrate 'W2' is etched as plasma 'P' is applied to the edge area of the second substrate 'W2', another one selected from the first bases 510 may be disposed between the temperature adjusting plate 700 and the dielectric plate 520, and another one selected from the second bases 610 may be disposed between the temperature adjusting plate 700 and the upper electrode 620.

In other words, according to an embodiment of the inventive concept, a condition for processing the plasma with respect to the substrate 'W' may be changed by changing the first base 510 and/or the second base 610 provided to the substrate processing apparatus 1000. For example, as illustrated in FIG. 4, when the first substrate 'W1' is processed, and when the higher etching rate is required with respect to the edge area of the first substrate 'W1', the first base 510 and the second base 610 may be provided to the substrate processing apparatus 1000 such that the space between the dielectric plate 520 and/or the upper electrode 620 becomes a first distance 'D1'. For example, as illustrated in FIG. 5, when the second substrate 'W2' different from the first substrate 'W1' is processed, and when the lower etching rate is required with respect to the edge area of the second substrate 'W2', the first base 510 and the second base 610 may be provided to the substrate processing apparatus 1000 such that the space between the dielectric plate 520 and/or the upper electrode 620 becomes a second distance 'D2'. The second distance 'D2' may be narrower than the first distance 'D1'.

The change in process condition resulting from the replacement of the first base 510 and the second base 610 is not limited to the change in the distance described above, but may be variously performed. For example, the processing rate for the substrate 'W' may be changed by changing the materials of the first base 510 and the second base 610 depending on the process condition required for the substrate 'W'. This is because the first base 510 and the second base 610 are spaced apart from each other, and the space between the first base 510 and the second base 610 forms a portion of the gas channel through which the process gas flows, so the materials of the first base 510 and the second base 610 correspond to factors exerting an influence on the generation of the plasma 'P'.

For example, when processing the first substrate W1, the first base 510 having the first material may be provided to the substrate processing apparatus 1000. Alternatively, when processing the second substrate W2 different from the first substrate W1, the first base 510 having the second material may be provided to the substrate processing apparatus 1000. When processing the first substrate W1, the second base 610 having the first material may be provided to the substrate processing apparatus 1000. Alternatively, when processing the second substrate W2 different from the first substrate W1, the second base 610 having the second material may be provided to the substrate processing apparatus 1000.

In addition, the shapes of the first base 510 and the second base 610 are varied depending on the processing condition required for the substrate 'W', thereby changing the above-described shape of the gas channel. When the shape of the gas channel is changed, even the flow path of the process gas flowing through the gas channel is changed. This is because the change in the flow path of the process gas corresponds to a factor exerting an influence on the generation of the plasma 'P'.

Although the above-described embodiments have been described in that the substrate processing apparatus 1000 performs the etching process with respect to the edge area of the substrate 'W', the inventive concept is not limited thereto. The fore-mentioned embodiments may be identically or similarly applied to various equipment and various processes requiring the processing for the edge area of the substrate 'W'.

A method for generating plasma in the substrate processing apparatus 1000, which has been described according to the above-described embodiments, may be an inductive coupled plasma (ICP) manner. In addition, the method for generating plasma in the substrate processing apparatus 1000 may be a capacitor couple plasma (CCP) manner. In addition, the substrate processing apparatus 1000 may generate the plasma 'P' by using both of the ICP manner and the CCP manner, or any one selected from the ICP manner and the CCP manner. In addition, the edge area of the substrate 'W' may be processed through a well-known manner for generating the plasma 'P' in addition to the above-described manner.

According to an embodiment of the inventive concept, the substrate may be efficiently processed.

In addition, according to an embodiment of the inventive concept, the plasma process for the substrate may be uniformly performed.

In addition, according to an embodiment of the inventive concept, the efficiency of the plasma process for the edge area of the substrate may be more enhanced.

The effects of the inventive concept are not limited to the above-described effects, and any other effects not mentioned herein will be clearly understood from the following description by those skilled in the art to which the inventive concept pertains.

The above description has been made for the illustrative purpose. Furthermore, the fore-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The fore-mentioned embodiment describes the best state for implementing the technical spirit of the inventive concept, and various changes required in the detailed application fields and purposes of the inventive concept can be made. Accordingly, the detailed description of the inventive concept is not intended to limit the inventive concept to the forms of the disclosed embodiments Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a housing having a process space;
   a gas supply unit configured to supply gas into the process space;
   a support unit including a chuck to support the substrate in the process space and a lower electrode to surround the chuck when viewed from a top;
   a temperature adjusting plate provided in the housing configured to generate at least one of heating energy and cooling energy;
   a dielectric plate unit coupled to the temperature adjusting plate, and having a dielectric plate disposed in opposite to the substrate supported by the support unit in the process space; and
   an upper electrode unit coupled to the temperature adjusting plate, and having an upper electrode disposed in opposition to the lower electrode,
   wherein the dielectric plate unit includes:
     a first base disposed between the dielectric plate and the temperature adjusting plate, the first base in direct contact with the temperature adjusting plate,
     wherein a thermal expansion rate of the first base is more similar to a thermal expansion rate of the temperature adjusting plate rather than a thermal expansion rate of the dielectric plate.

2. The apparatus of claim 1, wherein the first base is formed of a material different from a material of the dielectric plate.

3. The apparatus of claim 2, wherein the first base is formed of a material identical to a material of the temperature adjusting plate.

4. The apparatus of claim 1, wherein the upper electrode unit includes:
   a second base configured to surround the first base when viewed from the top, and disposed between the upper electrode and the temperature adjusting plate, and
   wherein the first base and the second base are spaced apart from each other to form a gas channel through which gas supplied by the gas supply unit flows.

5. The apparatus of claim 4, wherein the gas supply unit includes:
   a first gas supply part configured to supply process gas, which is excited to be in a plasma state, to the gas channel.

6. The apparatus of claim 4, wherein the second base is formed of a material identical to a material of the temperature adjusting plate.

7. The apparatus of claim 4, wherein a thermal expansion rate of the second base is more similar to a thermal expansion rate of the temperature adjusting plate rather than a thermal expansion rate of the upper electrode.

8. The apparatus of claim 4, wherein a discharge end of the gas channel is formed toward an edge area of the substrate supported by the support unit.

9. The apparatus of claim 4, wherein the dielectric plate includes:
 a gas passage through which gas supplied by the gas supply unit flows, and
 wherein a discharge end of the gas passage is formed toward a central area of the substrate supported by the support unit.

10. The apparatus of claim 9, wherein the gas supply unit includes:
 a second gas supply part configured to supply inert gas to the gas passage.

11. The apparatus of claim 1, wherein the first base comprises a first surface that is in direct contact with the temperature adjusting plate and a second surface coupled to the dielectric plate,
 wherein a width of the dielectric plate matches a width of the second surface of the first base.

12. The apparatus of claim 11, wherein the second surface of the first base comprises a step shape such that a height of a central area of the first base is higher toward the temperature adjusting plate than a height of an edge area of the first base,
 wherein a surface the dielectric plate, coupled to the first base, comprises a step shape corresponding to the step shape of the first base.

13. The apparatus of claim 7, wherein the second base is in direct contact with the temperature adjusting plate.

* * * * *